US007428683B2

(12) United States Patent
Dai et al.

(10) Patent No.: US 7,428,683 B2
(45) Date of Patent: Sep. 23, 2008

(54) AUTOMATIC ANALOG TEST AND COMPENSATION WITH BUILT-IN PATTERN GENERATOR AND ANALYZER

(75) Inventors: Fa Dai, Auburn, AL (US); Charles E. Stroud, Auburn, AL (US)

(73) Assignee: Auburn University, Auburn, AL (US)

(*) Notice: Subject to any disclaimer, the term of this patent is extended or adjusted under 35 U.S.C. 154(b) by 394 days.

(21) Appl. No.: 11/188,159

(22) Filed: Jul. 22, 2005

(65) Prior Publication Data

US 2006/0020865 A1  Jan. 26, 2006

Related U.S. Application Data

(60) Provisional application No. 60/652,410, filed on Feb. 11, 2005, provisional application No. 60/590,200, filed on Jul. 22, 2004.

(51) Int. Cl.
*G01R 31/316* (2006.01)
*G01R 31/40* (2006.01)

(52) U.S. Cl. .................. 714/740; 714/738; 714/733

(58) Field of Classification Search .................. None
See application file for complete search history.

(56) References Cited

U.S. PATENT DOCUMENTS

| | | | | |
|---|---|---|---|---|
| 2,751,555 A | * | 6/1956 | Kirkpatrick | 324/89 |
| 4,185,242 A | * | 1/1980 | Schaible | 455/226.3 |
| 5,546,049 A | * | 8/1996 | Wen et al. | 330/277 |
| 6,424,138 B1 | * | 7/2002 | Brownstein | 324/76.24 |
| 2002/0193961 A1 | * | 12/2002 | Bilas | 702/123 |
| 2003/0095607 A1 | * | 5/2003 | Huang et al. | 375/296 |

OTHER PUBLICATIONS

Stroud et al., Design verification techniques for system level testing using ASIC level BIST implementation, ASIC Conference and Exhibit, Sep. 27-Oct. 1, 1993, Sixth Annual IEEE International, pp. 140-143.*
"A 300-MHz Quadrature Direct Digital Synthesizer/Mixer in 0.25-μm CMOS" Arthur Torosyan et al., IEEE Journal of Solid-State Circuits, vol. 38, No. 6, Jun. 2003 pp. 875-887.
"An Automated BIST Approach for Mixed-Signal Systems" Charles Stroud et al., Proceedings of the IEEE North Atlantic Test Workshop, May 1, 2004, pp. 202-209.
"Analog Circuit Testing Using Built-In Direct-Digital Sythesis" Qi Shuying et al., Proceedings of the IEEE North Atlantic Test Workshop, May 1, 2004, pp. 190-195.
"A Mixed Signal Built-In Self-Test Approach for Analog Circuits" Charles Stroud et al., Mixed-Signal Design, 2003, Southwest Symposium on Feb. 23-25, 2003, Piscataway, NJ, USA, IEEE, pp. 196-201.

* cited by examiner

*Primary Examiner*—Guy Lamarre
*Assistant Examiner*—Dipakkumar Gandhi
(74) *Attorney, Agent, or Firm*—Andrus, Sceales, Starke & Sawall, LLP

(57) ABSTRACT

A built-in-self test (BIST) scheme for analog circuitry functionality tests such as frequency response, gain, cut-off frequency, signal-to-noise ratio, and linearity measurement. The BIST scheme utilizes a built-in direct digital synthesizer (DDS) as the test pattern generator that can generate various test waveforms such as chirp, ramp, step frequency, two-tone frequencies, sweep frequencies, MSK, phase modulation, amplitude modulation, QAM and other hybrid modulations. The BIST scheme utilizes a multiplier followed by an accumulator as the output response analyzer (ORA). The multiplier extracts the spectrum information at the desired frequency without using Fast Fourier Transform (FFT) and the accumulator picks up the DC component by averaging the multiplier output.

42 Claims, 7 Drawing Sheets

AUTOMATIC ANALOG TEST AND COMPENSATION WITH BUILT-IN PATTERN GENERATOR AND ANALYZER

CROSS REFERENCE TO RELATED APPLICATION(S)

The present Application is based on and claims priority under 35 U.S.C. §119(e) of the co-pending U.S. Provisional Patent Application, Ser. No. 60/590,200, filed Jul. 22, 2004, and entitled "AUTOMATIC ANALOG TEST & COMPENSATION WITH BUILT-IN PATTERN GENERATOR & ANALYZER". The U.S. Provisional Patent Application, Ser. No. 60/590,200, filed Jul. 22, 2004, and entitled "AUTOMATIC ANALOG TEST & COMPENSATION WITH BUILT-IN PATTERN GENERATOR & ANALYZER" is also hereby incorporated by reference.

The present Application is based on and claims priority under 35 U.S.C. §119(e) of the co-pending U.S. Provisional Patent Application, Ser. No. 60/652,410, filed Feb. 11, 2005, and entitled "AUTOMATIC ANALOG TEST & COMPENSATION WITH BUILT-IN PATTERN GENERATOR & ANALYZER". The U.S. Provisional Patent Application, Ser. No. 60/652,410, filed Feb. 11, 2005, and entitled "AUTOMATIC ANALOG TEST & COMPENSATION WITH BUILT-IN PATTERN GENERATOR & ANALYZER" is also hereby incorporated by reference.

FIELD OF THE INVENTION

The invention relates to the field of analog functionality testing, including but not limited to, analog functionality testing in mixed signal systems and high-speed radio frequency integrated circuits (RFIC).

BACKGROUND OF THE INVENTION

Analog functionality testing in mixed signal systems and high-speed radio frequency integrated circuits (RFIC) is a time-consuming and costly process based on the current methodology of manual analog testing. Typical test costs, as a percentage of the manufacturing cost, can be as high as 50% of the total cost, depending on the complexity of the functionality to be tested. The overall cost of an RF system consists of manufacturing, testing (wafer sort and final testing) and packaging. The DC wafer test for RFICs is mainly digital using cheap testers to prune away defective devices. Typically, the RF circuitry is bypassed due to the high cost of RF testers. Unfortunately, RF packaging can represent 30% of the overall cost. Current test practices are expensive because of, among other reasons, the required tester infrastructure, long test times, cumbersome test preparation, lack of appropriate defect and fault models, and lack of standardized test methods.

It is therefore highly desirable to automate the analog testing process with low cost, Built-In Self-Test (BIST) circuitry. Analog test features built into the RF and base-band ASICs can provide not only analog test capability, but also an efficient technique for calibrating and compensating analog circuitry that is sensitive to temperature, supply voltage and process variations. BIST and design for testability (DFT) of analog circuits are important and necessary to produce highly reliable mixed-signal circuits. These approaches normally focus on one or two simple parameter tests such as cut-off frequency of a filter and cannot perform rigorous and complete analog tests such as frequency response, linearity, noise and modulation tests.

The primary goal of prior art was to overcome the complexity of integrating a traditional AC characterization approach. Some AC BIST techniques inject optimized digital inputs into a linear device under test and extract a DC signature. These approaches are simple, but their precision is limited. On the other hand, several methods have been proposed to make frequency-domain tests using on-chip generated sine waves and analyzing the results with an on-chip digital signal processor (DSP). The approach requires 1-bit sigma-delta digital-to-analog converters (DACs) with moderate area overhead. The precision of the generated frequency is not fine enough to support some analog tests such as various analog modulation and linearity test using precise two-tones.

SUMMARY OF THE INVENTION

A built-in-self test (BIST) scheme for analog circuitry functionality tests such as frequency response, gain, cut-off frequency, signal-to-noise ratio, and linearity measurement. The BIST scheme utilizes a built-in direct digital synthesizer (DDS) as the test pattern generator that can generate various test waveforms such as chirp, ramp, step frequency, two-tone frequencies, sweep frequencies, MSK, phase modulation, amplitude modulation, QAM and other hybrid modulations. The BIST scheme utilizes a multiplier followed by an accumulator as the output response analyzer (ORA). The multiplier extracts the spectrum information at the desired frequency without using Fast Fourier Transform (FFT) and the accumulator picks up the DC component by averaging the multiplier output.

A linearity measurement circuit which comprises a test pattern generator for generating a first sine wave pattern, a second sine wave pattern, and a third sine wave pattern, each sine wave pattern in the form of a digital signal, wherein the first sine wave pattern and the second sine wave pattern are summed by an adder and supplied to a D-A converter and an analog circuit under test, an A-D converter operative to convert an analog signal outputted from the analog circuit under test to a digital output signal, and an output response analyzer including a first multiplier and accumulator pair for multiplying and accumulating the digital output signal and the second sine wave pattern to generate a first signal power, and a second multiplier and accumulator pair for multiplying and accumulating the digital output signal and the third sine wave pattern to generate a second signal power. The linearity measurement circuit wherein the test pattern generator comprises a plurality of direct digital synthesizers (DDS) outputting the sine wave patterns, wherein each DDS comprises an accumulator and a read-only memory (ROM), and wherein the ROM is a look-up table. The linearity measurement circuit wherein a set of phase delay measurements from the circuit correct the linearity measurement and further comprises a multiplexer configured to timeshare the output response analyzer. The linearity measurement circuit wherein the set of phase delay measurements monitor performance of an analog circuit and adaptively adjust the analog circuit. The linearity measurement circuit of claim 1 wherein the linearity measurement circuit is incorporated in an Applications-Specific Integrated Circuit (ASIC) for making on-chip measurements, wherein the linearity measurement circuit is incorporated in an ASIC for making in-system measurements, and wherein the linearity measurement circuit is incorporated in an external test device for manufacturing testing of an analog circuit. The linearity measurement circuit wherein the linearity measurement circuit is synthesized into a programmable logic device for off-line test, measurement and compensation, wherein the programmable logic device is an FPGA, and wherein the circuit is used for test, measurement and compensation of an RF circuit.

A phase and gain measurement circuit which comprises a test pattern generator for generating a sine wave pattern and a cosine wave pattern, each wave pattern in the form of a digital signal, and supplying the sine wave pattern to a D-A converter and an analog circuit under test, an A-D converter operative to convert an analog signal outputted from the analog circuit under test to a digital output signal, and an output response analyzer including a first multiplier and accumulator pair for multiplying and accumulating the digital output signal and the sine wave pattern to generate a first signal power and a second multiplier and accumulator pair for multiplying and accumulating the digital output signal and the cosine wave pattern to generate a second signal power. The phase and gain measurement circuit wherein the test pattern generator comprises a plurality of direct digital synthesizers (DDS) outputting the sine wave pattern and the cosine wave pattern, wherein each DDS comprises an accumulator and a read-only memory (ROM), and wherein the ROM is a look-up table. The phase and gain measurement circuit wherein a frequency response including at least one of a gain and phase delay measurement is measured by the phase-and-gain measurement circuit. The phase and gain measurement circuit wherein the phase delay measurements from the phase-and-gain measurement circuit are used to correct a linearity measurement, wherein the phase-and-gain measurement circuit with the phase delay measurements correct a signal-to-noise ratio, and wherein the at least one of a gain-and-phase measurements monitors performance of an analog circuit and adaptively adjusts the analog circuit. The phase and gain measurement circuit wherein the phase-and-gain measurement circuit is incorporated in an ASIC for making on-chip measurements, wherein the phase-and-gain measurement circuit is incorporated in an ASIC for making in-system measurements, and wherein the phase-and-gain measurement circuit is incorporated in an external test device for manufacturing testing of an analog circuit. The phase and gain measurement circuit wherein the phase-and-gain measurement circuit is synthesized into a programmable logic device for off-line test, measurement and compensation, wherein the programmable logic device is an FPGA, and wherein the circuit is used for test, measurement and compensation of RF circuits, further comprising a multiplexer configured to timeshare the output response analyzer.

A signal-to-noise measurement circuit which comprises a test pattern generator for generating a first sine wave pattern, a second sine wave pattern, and a cosine wave pattern, each sine wave pattern in the form of a digital signal, wherein the first sine wave pattern is supplied to a D-A converter and an analog circuit under test, an A-D converter operative to convert an analog signal outputted from the analog circuit under test to a digital output signal, and an output response analyzer including a first multiplier and accumulator pair for multiplying and accumulating the digital output signal and the second sine wave pattern to generate a first signal power, and a second multiplier and accumulator pair for multiplying and accumulating the digital output signal and the cosine wave pattern to generate a second signal power. The signal-to-noise measurement circuit wherein the test pattern generator comprises a plurality of direct digital synthesizers (DDS) outputting the sine wave patterns and the cosine wave patterns, wherein each of the DDS includes an accumulator and a read-only memory (ROM), and wherein the ROM is a look-up table. The signal-to-noise measurement circuit wherein the signal-to-noise measurement circuit uses a set of phase delay measurements to measure the signal-to-noise ratio, wherein the set of phase delay measurements monitor performance of an analog circuit and adaptively adjusts the analog circuit, and wherein the signal-to-noise measurement circuit is incorporated in an ASIC for making on-chip measurements. The signal-to-noise measurement circuit wherein the signal-to-noise measurement circuit is incorporated in an ASIC for making in-system measurements, wherein the signal-to-noise measurement circuit is incorporated in an external test device for manufacturing testing of an analog circuit, and wherein the signal-to-noise measurement circuit is synthesized into a programmable logic device for off-line test, measurement and compensation. The signal-to-noise measurement circuit wherein the programmable logic device is an FPGA and wherein the signal-to-noise measurement circuit is used for test, measurement and Compensation of an RF circuit, further comprising a multiplexer configured to timeshare the output response analyzer.

A built-in self test (BIST) architecture for an analog circuit functionality test which comprises a direct digital synthesizer (DDS) configured to generate a test waveform, a D-A converter configured to receive and convert the test waveform to an analog signal, wherein the analog signal is an input signal for a device under test, an A-D converter configured to receive an output from the device under test, and further configured to convert the output to a digital signal, and an output response analyzer (ORA), wherein the ORA includes a multiplier configured to receive the digital signal and the test waveform, and further configured to extract a set of spectrum information at a desired frequency, and an accumulator coupled to the multiplier, wherein the accumulator is configured to average an output of the multiplier, wherein the test waveform is generated over a number of clock cycles and the accumulator collects the output from the analog circuit.

DESCRIPTION OF THE INVENTION

Figure 1:
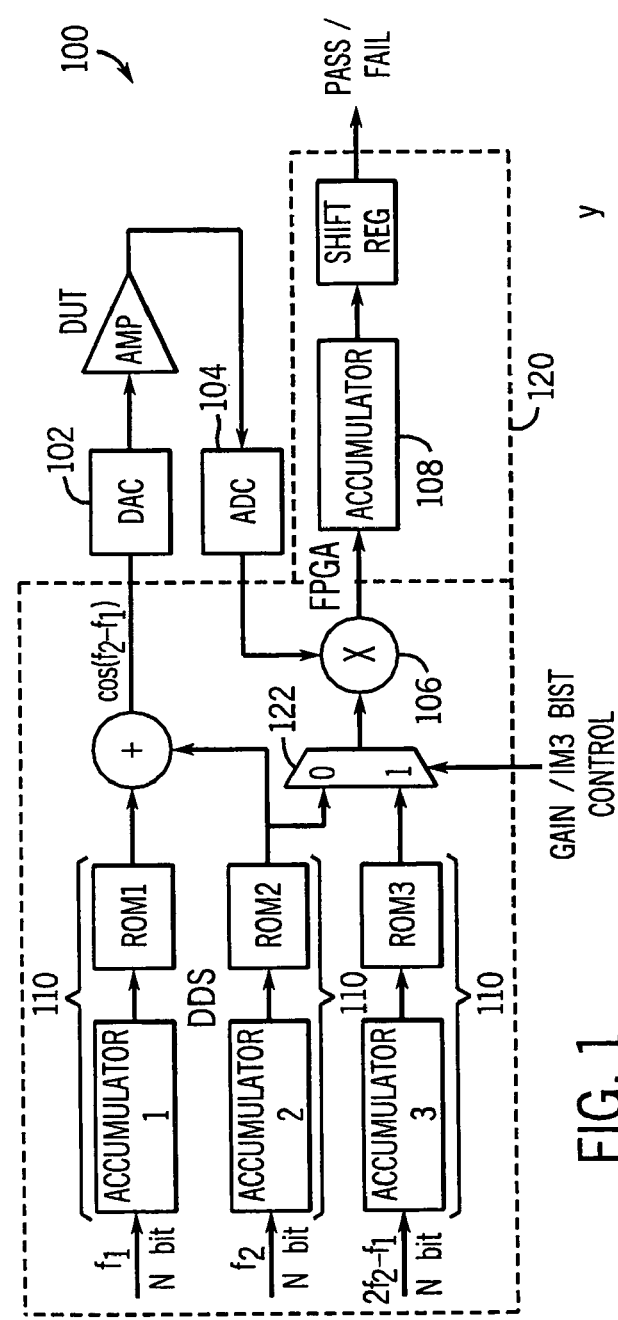
FIG. 1 illustrates a schematic diagram according to an embodiment of the present invention.

A DDS 110 based BIST architecture 100, which can generate various modulated waveforms and frequency tones for analog functionality test is described herein. A schematic diagram illustrating this BIST architecture 100 is illustrated in FIG. 1. This DDS 110 based BIST architecture 100 detects faults and assists in characterization and calibration during manufacturing and field testing. Embodiments for base-band digital test features such as the test pattern generator (TPG) and output response analyzer (ORA) 134, the functionality is synthesized in Field Programmable Gate Array (FPGA) 120 circuitry, while other embodiments fabricate the design in a CMOS application specific integrated circuit (ASIC). Preferably, in operation the vast majority of the BIST circuitry 100 resides in the digital portion of the subject mixed-signal system being tested to minimize performance impact on the analog circuitry. The only test circuitry added to the analog domain of the system being tested are analog multiplexers needed to facilitate the return path for the test signals to the BIST circuitry 100. The test scheme utilizes the existing digital to analog (DAC) 102 and analog to digital converter (ADC) 104 associated with conventional transceiver baseband architectures, and thus provides accurate analog testing means with low area overhead.

The DDS 110 based TPG can provide precise frequency tones for many analog tests, including amplifier linearity normally measured by the $3^{rd}$ order inter-modulation product (IP3) under two-tone test. The area penalty associated with a conventional DDS 110 approach is minimized by using a delta-sigma noise shaping scheme. The DDS 110 can implement various waveforms such as chirp, ramp, step frequency, MSK, phase modulation, amplitude modulation, QAM and other hybrid modulations. The modulated waveforms generation is a unique feature of the DDS 110 based BIST 100 architecture. None of the prior art analog testing schemes can perform such complete waveform generation as that of the DDS 110 synthesizer/modulator.

The BIST 100 architecture is capable of analog circuitry functionality tests such as frequency response, gain, cut-off frequency, linearity measurement and so on. The BIST 100 architecture utilizes the DDS 110 as the test pattern generator that can generate various test waveforms such as, but not limited to, chirp, ramp, step frequency, two-tone frequencies, sweep frequencies, MSK, phase modulation, amplitude modulation, QAM and other hybrid modulation.

The BIST includes a multiplier 106 coupled with an accumulator 108, wherein the accumulator and the multiplier functions as an output response analyzer (ORA) 134. The multiplier 106 extracts the spectrum information at the desired frequency without using Fast Fourier Transform (FFT) and the accumulator 108 picks up the DC component by averaging the multiplier 106 output.

The BIST architecture 100 provides not only analog test capability, but also an efficient technique for calibrating and compensating analog circuitry that is sensitive to temperature, supply voltage and process variations, and facilitates on-chip test, diagnosis, and calibration without the need for expensive external test equipment and, as a result, can be used at all levels of testing, from manufacturing to system-level field testing.

The DDS 110 based TPG can provide precise frequency tones for many analog tests, including amplifier linearity normally measured by the $3^{rd}$ order inter-modulation product (IP3) under two-tone test. The ORA consists of the multiplier 106 and the accumulator 108, where the output response of the analog circuit under test is multiplied by a tone produced by the DDS 110 based TPG and the result of the multiplication is added to the contents of the accumulator 108. The tone produced by the DDS 110 is outputted in this embodiment by the multiplexer 122, which is used to timeshare the ORA 134. At the end of the BIST 100 sequence, the contents of the accumulator 108 gives a value proportional to the power of the analog output response at the base frequency with which it is multiplied.

Figure 2:
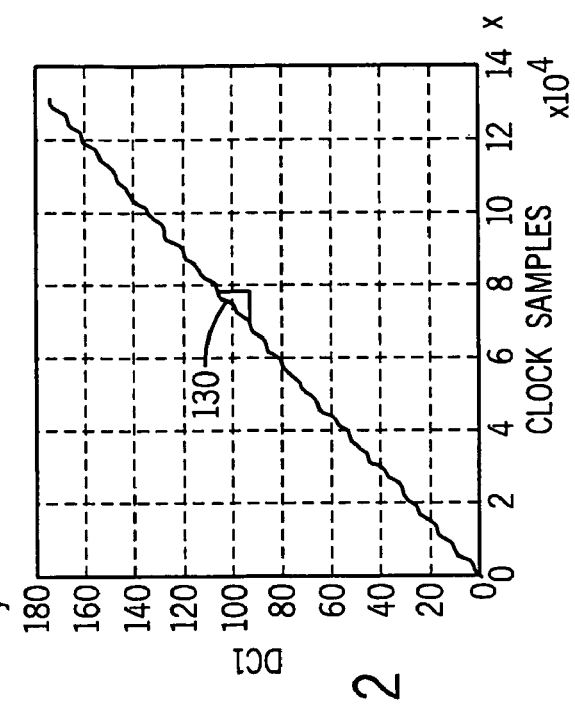
FIG. 2 illustrates a graphical representation of the contents of ORA according to an embodiment of the present invention.

This response is illustrated in FIG. 2, where the contents of the accumulator 108 (FIG. 1) is shown on the y-axis in DC 1 as a function of time on the x-axis in clock samples. The value of interest is the slope 130 of the line which can be obtained by dividing the contents of the accumulator 108 by the total number of clock cycles used for the accumulation process. This resultant power measurement is similar to the function performed by a Fast Fourier Transform (FFT), but the multiplier/accumulator based ORA 134 is much more efficient from an area and performance stand-point since it considers only the based frequency input to the multiplier 106 rather than the full spectrum of frequencies considered by an FFT and, therefore, much more suitable for incorporation in the device or system for BIST 100 applications. Furthermore, the BIST 100 approach provides more precise frequency control than an FFT for measuring analog functionality.

Referring back to FIG. 1, the multiplier/accumulator 106, 108 based ORA 134 provides a solution to the problem of the effect of delay in the phase of the analog output response on the measurement of analog functionality such as linearity and gain frequency response. As the phase of the analog output response changes with respect to the TPG input waveform to the multiplier, the power of the signal at base frequency will change as well. In other words, the slope 130 of the line in FIG. 2 will change as the phase changes. Unless the phase is known, the accuracy of the resultant analog functionality measurements cannot be known. However, since the slope 130 of the line in FIG. 2 is a function of the phase of the analog output response, multiple measurements may be made using a different phase associated with the based frequency to the multiplier to accurately determine the phase of the analog output response as a function of frequency.

For example, FIG. 2 shows a result where the analog output response is in phase with the input test waveform, while an analog output response that is 180 degrees out of phase with the input test waveform will produce the same results but with a negative slope. Therefore, by making the measurement at least twice, the second time with an input to the multiplier that is 90 degrees out of phase with the first TPG input to the multiplier, the phase of the analog output response can be determined with good accuracy. The accuracy of the phase measurement can be improved with additional measurements. For example, using an input to the multiplier that is 45 degrees out of phase with the first TPG input to the multiplier. With this phase response information, other analog functionality measurements, such as linearity or gain, can be adjusted to obtain more accurate measurement for more accurate fault detection and/or on-chip compensation.

Figure 3:
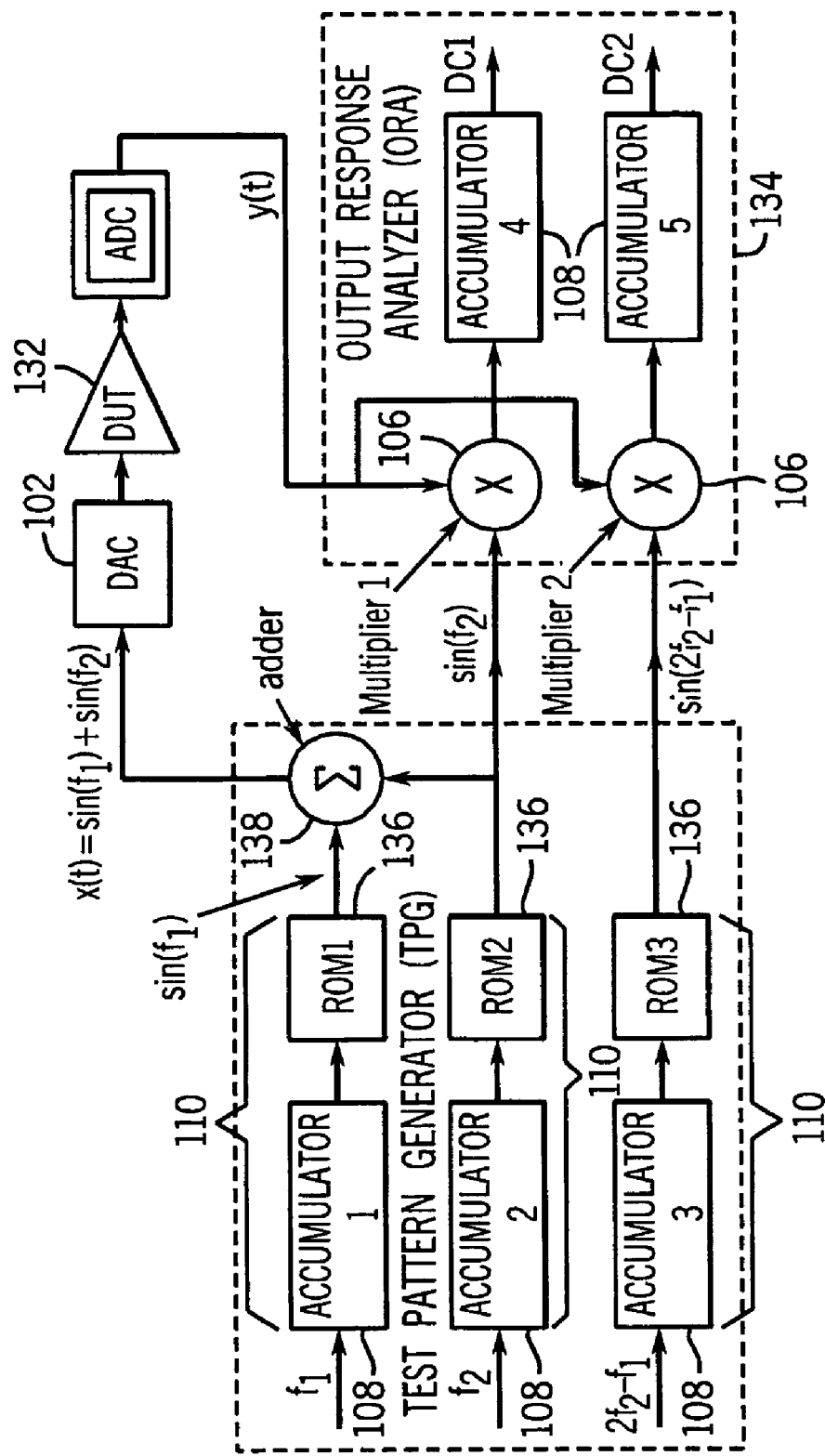
FIG. 3-FIG. 5 illustrate a schematic diagram according to an embodiment of the present invention.

Referring to FIG. 3, during linearity measurement, three DDSs 110 are used to generate the test waveform to the analog device under test (DUT) 132 as well as the frequencies at which we want to extract the DC information in the ORA 134. Each DDS 110 consists of an accumulator 108 and a read-only-memory (ROM) 136, also referred to as a look-up table (LUT). The sum of the $1^{st}$ two DDS 110 outputs is converted to the analog signal using a digital-analog converter 102, while the digital outputs of the $2^{nd}$ and the $3^{rd}$ DDSs 110 are also be used in ORA 134. Accumulators 1 and 2 (108) in conjunction with their associated ROMs 136 produce a two-tone signal, x(t), to be sent to the DUT 132 by summing the sine wave at frequency $f_1$ and the sine wave at frequency $f_2$ in the adder 138. Accumulator 2 (108) and ROM 2 (136) also produce the sine wave at frequency $f_2$ that is sent to the ORA 134 for extraction of the signal power (DC1) at frequency $f_2$. Accumulator 3 (108) and ROM 3 (136) produce the sine wave at frequency $2f_2-f_1$ that is sent to the ORA 134 for extraction of the signal power (DC2) at frequency $2f_2-f_1$.

The signal power DC1 is extracted by multiplying the DUT response, y(t), by the sine wave at frequency $f_2$, $\sin(f_2)$, in Multiplier 1 (106) and accumulating the result in Accumulator 4 (108). The signal power DC2 is extracted by multiplying the DUT 132 response, y(t), by the sine wave at frequency $2f_2-f_1$, $\sin(2f_2-f_1)$, in Multiplier 2 (106) and accumulating the result in Accumulator 5 (108). The difference between he fundamental tone and the $3^{rd}$ order inter-modulated tone ($\Delta P$) is then calculated by $\Delta P=20 \log(DC1)-20 \log(DC2)$. In this design, DC1 and DC2 are extracted simultaneously. The linearity measurement (IIP3) can be found out by $$IIP_3[dBm] = \frac{\Delta P[dB]}{2} + P_{in}[dBm],$$

where $P_{in}$ is the input signal power at the DUT.

Still referring to FIG. 3, the total amount of logic is reduced by time-sharing the multiplier/accumulator ORA 134 by multiplexing the two sine waves for extracting DC1 and DC2 as illustrated in FIG. 1. The test is ran twice—once with y(t) multiplied by the sine wave at frequency $f_2$, $\sin(f_2)$, to obtain DC1 and a second time with y(t) multiplied by the sine wave at frequency $2f_2-f_1$, $\sin(2f_2-f_1)$, to obtain DC2. As a result area overhead is reduced at the expense of doubling the test time. Time sharing the DDSs 110 in TPG is also possible.

Figure 4:
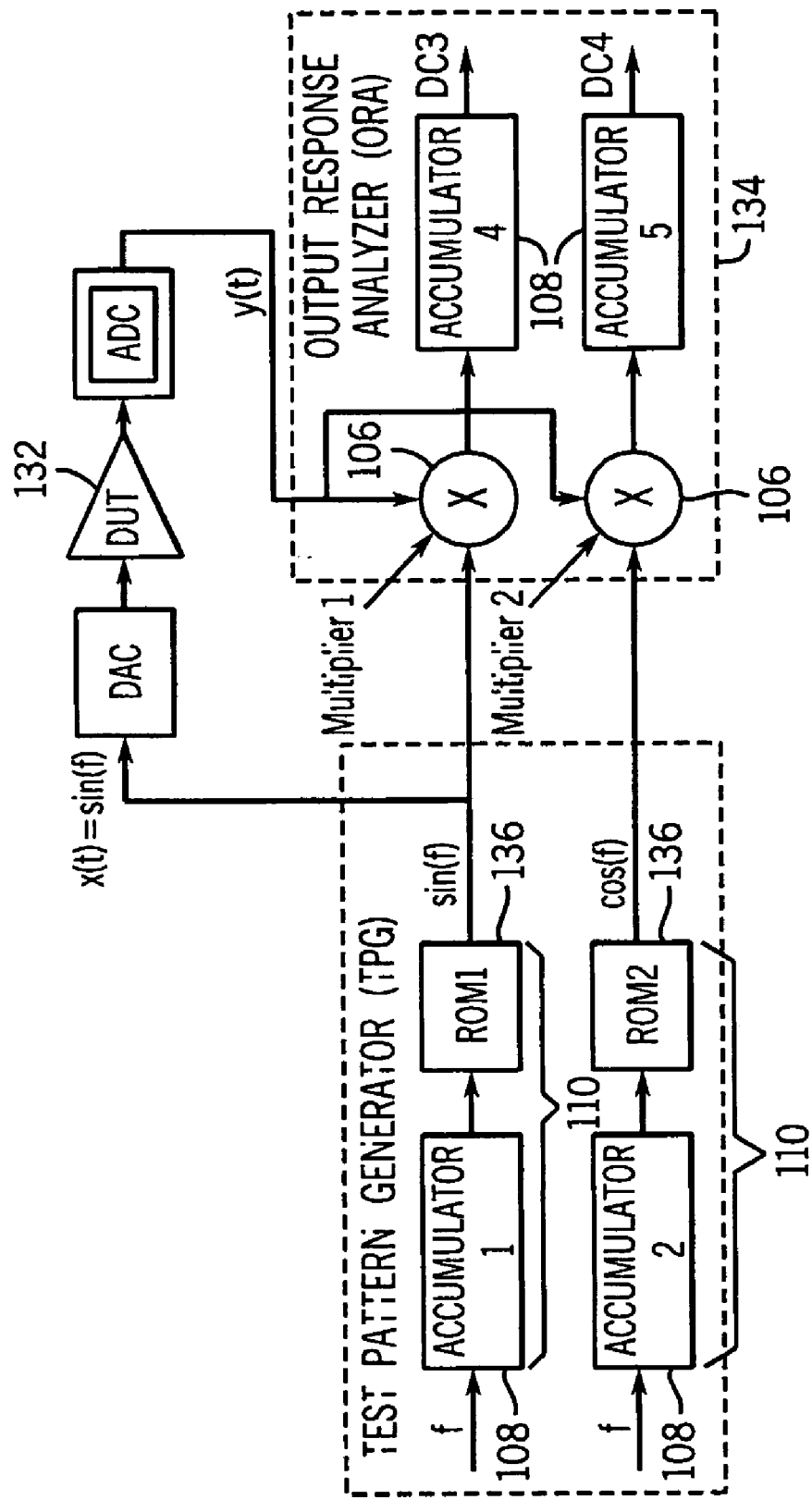

Referring now to FIG. 4, during gain and phase measurements for frequency response, only two DDSs 110 are needed and, as a result, this measurement uses a subset of the circuitry of the linearity measurement circuitry in FIG. 3. In this case, there is no adder 138 (FIG. 3) and the look-up table for ROM 2 136 produces a cosine wave instead of a sine wave. During the test, a frequency value, f, is to the inputs of Accumulators 1 and 2 (108) which, in conjunction with their respective ROM 1 and ROM 2 (186), produce a sine wave, sin(f), and a cosine wave, cos(f). The sine wave, sin(f), is applied to the DUT 132 and the output response y(t) is multiplied by both sin(f) and cos(f) by Multiplier 1 and 2 (106), respectively. The outputs of the multipliers are accumulated in Accumulator 4 and Accumulator 5 (108) to extract DC3 and DC4 respectively. The phase delay, $\Delta \phi$, of y(t) with respect to sin(f) is then calculated by $\Delta \phi = \tan^{-1}(DC3/DC4)$. From this phase measurement, the gain can be calculated by Gain=DC3/cos $\Delta \phi$=DC4/sin $\Delta \phi$. Again in this embodiment, phase and gain are measured at the same time for frequency f since DC3 and DC4 are extracted simultaneously. Note that time-sharing of the ORA 134 can be accomplished in the same manner as in FIG. 1, but running the test twice—once selecting sin(f) at the input to the multiplier 106 to extract DC3 and again selecting cos(f) to extract DC4. To obtain the complete frequency response of the DUT 132, a series of phase and gain measurements are made by changing the value of f during each measurement such that we sweep through the various frequencies to obtain the complete frequency response (gain and phase as a function of f). It should also be noted that the phase measurement can be used to obtain a more accurate linearity measurement ( ) by correcting the DC1 and DC2 values based on the phase delay measurement at frequencies the $f_2$ and $2f_2-f_1$ in the same manner as the Gain correction. In FIG. 4, the two DDSs 110 in the TPG can also be combined. With additional circuits, the quadrature signals sin(f) and cos(f) can be generated using only one accumulator 108 and one ROM 136.

Figure 5:
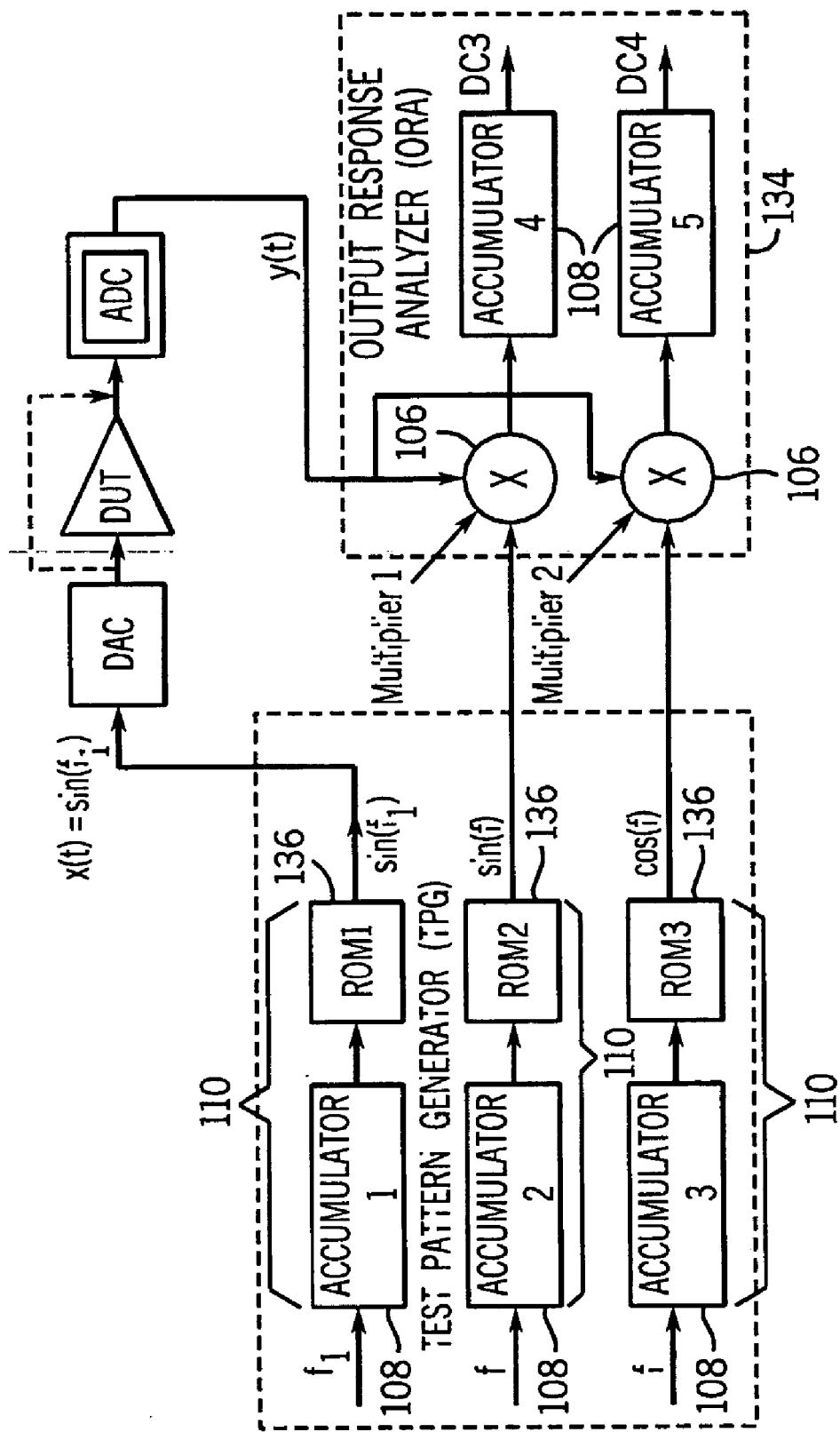

Referring now to FIG. 5, during signal-to-noise ratio measurement, all three DDSs 110 are again used, although the $2^{nd}$ and $3^{rd}$ DDSs 110 can be combined. This measurement uses a subset of the circuitry of the linearity measurement circuitry in FIG. 3 since the adder 138 (FIG. 3) is not used. During this measurement, a constant test wave form at frequency value, $f_1$, is produced by Accumulator 1 (108) and ROM 1 and ROM 2 (136). The resultant sine wave, $\sin(f_1)$, is applied to the DUT 132 for the entire test. The other two DDSs 110 are used to produce a sine wave and cosine wave at frequency f, similar to the frequency response measurement described above. The output response y(t) is multiplied by both sin(f) and cos(f) by Multiplier 1 and 2 (106), respectively. The outputs of the multipliers 106 are accumulated in Accumulator 4 and Accumulator 5 (108) to extract DC3 and DC4 respectively. The phase and gain of y(t) with respect to sin(f) is then calculated by the same method as in the frequency response measurement. Again in this design, phase and gain are measured at the same time for frequency f since DC3 and DC4 are extracted simultaneously. This gives the amplitude of the noise produced in the system at frequency f. To obtain the complete signal-to-noise ratio, a series of phase and gain measurements are made by changing the value of f during each measurement such that we sweep through the various frequencies (excluding frequency $f_1$), averaging the measured noise. A phase and gain measurement is made a frequency $f_1$ in order to obtain the gain of the signal at frequency $f_1$ with the final signal-to-noise ratio obtain by the dividing the gain of the signal but the average of the noise. To measure the noise figure (NF) of the DUT 132, the signal-to-noise ratios (SNR) at both the input and the output of the DUT 132 should be measured. The NF of the DUT can then be calculated as the ratio of the input SNR to the output SNR:

$$NF = \frac{SNR_{in}}{SNR_{OUT}}.$$

Frequency Response Test Using DDS

One of major problems associated with integrated analog filters is the cutoff frequency variation due to temperature, supply voltage and process variations. If the cut-off frequency can be monitored on the fly during transmission idle periods (e.g., the preamble period in WLAN applications), its variation can be compensated using built-in tunable circuitry in LPF designs. In addition to production test, the frequency response monitoring can also be used to adjust the gain and bandwidth of the amplifier for multi-band and multi-standard applications. With wireless standards operating in very different frequency bands, market-leading wireless solutions have to offer multi-mode interoperability with transparent worldwide usage. Thus, the base-band gain stage needs to be tunable for different wireless standards. The BIST approach can be used to calibrate the frequency response of the baseband gain stage and LPF in this connection.

Frequency response (both gain and phase response) is the key measure for an integrated LPFs and amplifiers. The commonly interested cut-off frequency of the filters and amplifiers can be found out by measuring the passband and stopband amplitude response, while the linearity (group delay) can be determined from the phase response. To test the base-band LPF in the transceiver RFIC, the DDS integrated in the baseband ASIC generates a single frequency tone that loops back from transmitter to receiver through multiplexer controls. The DDS generates frequency tones with fine resolution. It can scan the pass and stop bands of the LPF with fine step size and can thus measure the cut-off frequency and passband and stopband ripples of the filter. However, since there is normally a phase difference between the external path through the DUT (amplifier) and the internal path from the test generator to the test analyzer, phase correction needs to be done prior to the frequency magnitude measurement.

To measure the frequency response, the DDS generates the test tone of $x(t)=A \cos \omega t$ that is applied to the input of an amplifier with transfer function of $y(t)=[\alpha_0+\alpha_1 x(t)+\alpha_2 x^2(t)+\alpha_3 x^3(t)+\ldots]\exp(j\Delta\Phi)$, where coefficients $\alpha_j$ is time invariant. Hence, the amplifier output is given by $$y(t) = \exp(j\Delta\phi)(\alpha_0 + \alpha_1 A \cos\omega t + \alpha_2 A \cos^2\omega t + \alpha_3 A \cos^3\omega t + \ldots) \quad (1)$$

$$= \exp(j\Delta\phi)\left\{\alpha_0 + \frac{\alpha_2 A^2}{2} + \left(\alpha_1 A + \frac{3\alpha_3 A^3}{4}\right)\cos\omega t + \frac{\alpha_2 A^2}{2}\cos 2\omega t + \frac{\alpha_3 A^3}{4}\cos 3\omega t\right\}$$

Note that if the input signal A is large, the nth harmonic grows approximately in proportion to $A^n$. Under small-signal assumption, i.e., the input signal A is small, the system is linear and the harmonics are negligible and the small-signal gain is $\alpha_1$. For large signal, nonlinearity becomes evident and the large-signal gain is $\alpha_1+\frac{1}{4}(\alpha_3 A^3)$, which varies when input level changes. If $\alpha_3<0$, the output is a "compressive" or "saturating" function of the input signal, namely, the gain is compressed when input magnitude A increases. For small input, the linear transfer function of the DUT reads $$y(t)\approx\exp(j\Delta\Phi)(\alpha_0+\alpha_1 A \cos \omega t) \quad (2)$$

In the ORA, we mix the amplifier output with the test frequency. Since there is normally a phase difference between the external path through the DUT (amplifier) and the internal path from the test generator to the test analyzer, we assume the test tone to be mixed with DUT output is of the form of A $\cos(\omega t)$. Accumulating the mixer output, we can obtain a DC term given as follows $$DC_3 \approx \frac{1}{2}\alpha_1 A^2 \cos\Delta\phi \cdot n \quad (3)$$

where n is the number of accumulation cycles and $\Delta\Phi$ denotes the phase difference. Next, we mix (multiply) the amplifier output with a test tone of A $\sin(\omega t)$. This mixing process produces another DC term $$DC_4 \approx \frac{1}{2}\alpha_1 A^2 \sin\Delta\phi \cdot n \quad (4)$$

Thus, the phase retardation $\Delta\Phi$ can be determined by $$\Delta\phi = tg^{-1}\frac{DC_4}{DC_3} \quad (5)$$

Once the phase difference is measured, the test tone for frequency response generated by DDS can be phase-adjusted such that the signals at the mixer inputs can be perfectly in-phase. In this connection, DDS should generate test tones in form of $x(t)=A \cos(\omega t-\Delta\Phi)$ for DUT and A $\cos(\omega t)$ for the mixer input in the ORA, respectively. Additional phase can be easily added to the phase word in the DDS architecture. Since the amplifier may not have a constant group delay, namely, the delay through the DUT is normally frequency dependent, the phase correction should be performed at each frequency step when DDS scan generates the test tones that scan the interested band.

Figure 6:
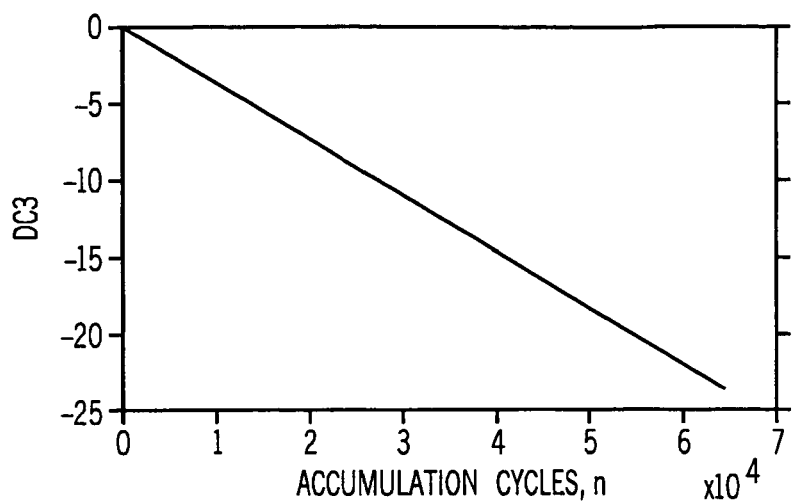
FIG. 6 illustrates a graphical representation of an accumulated $DC_3$ component of DUT output mixed with A cos($\omega$t), phase difference $\Delta\Phi=135°$.
Figure 7:
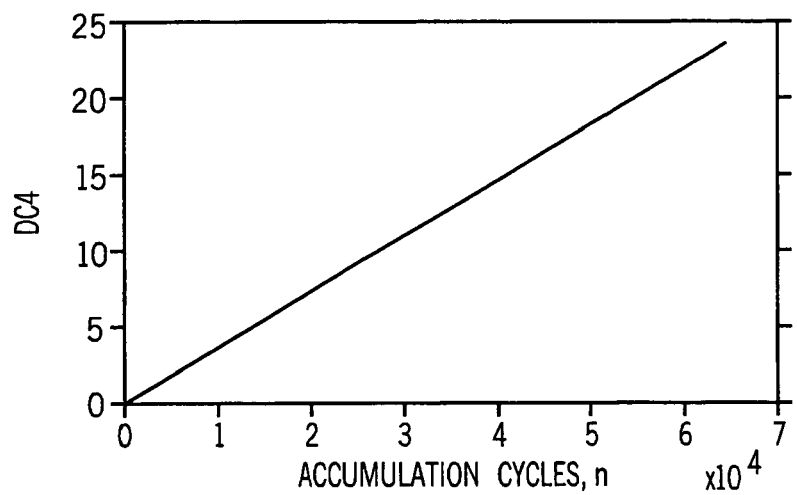
FIG. 7 illustrates a graphical representation of an accumulated DC4 component of DUT output mixed with A sin($\omega$t), phase difference $\Delta\Phi=135°$.

FIG. 6 shows the ORA accumulated DC3 component of the DUT output mixed with A $\cos(\omega t)$ with phase difference $\Delta\Phi=135$ deg. And FIG. 7 gives the ORA accumulated DC4 component of the DUT output mixed with A $\sin(\omega t)$ with phase difference $\Delta\Phi=135$ deg. Notice the slope of DC3 is negative due to the cos $\Delta\Phi$ term in Eq. (3), while the slope of DC4 is positive due to the sin $\Delta\Phi$ term in Eq. (4). Based on the sign of DC3 and DC4, we can thus determine the quadrant of the phase difference. Once the phase difference is determined, the actual phase corrected frequency response can be found from either of the DC3 or DC4 measurements as $$DC = \frac{DC_3}{\cos\Delta\phi} = \frac{DC_4}{\sin\Delta\phi} \quad (6)$$

For better accuracy, it's preferred to use the DC term with the larger slope. For certain phase difference such as the angles close to 0 deg or 90 deg, one of the DC terms can approach zero. In those cases, the relative phase difference $\Delta\Phi$ can be adjusted by programming the desired phase delay in DDS.

Figure 8:
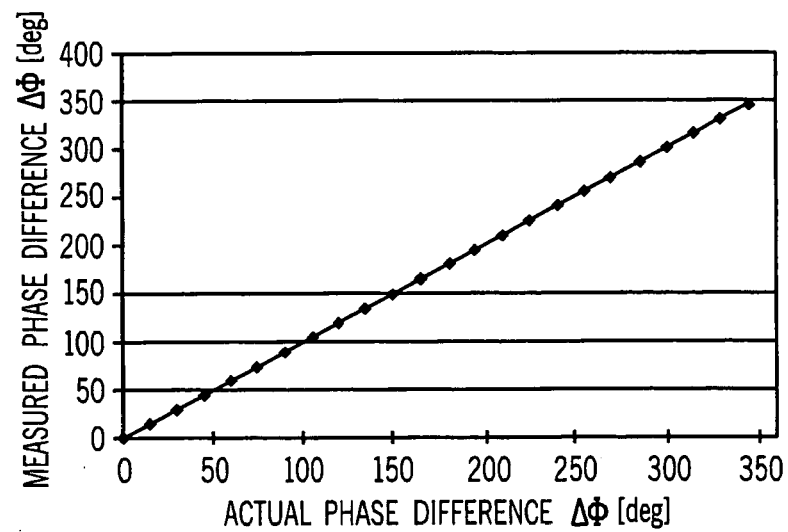
FIG. 8 illustrates a graphical representation of a BIST measured phase difference versus the actual $\Delta\Phi$.

FIG. 8 compares measured phase difference versus the actual $\Delta\Phi$ by programming a propagation delay line. As shown, the proposed phase detection scheme truthfully measures the phase difference, which ensures the accuracy of the proposed BIST scheme for linearity and frequency response measurements.

Amplifier Linearity (IP3) Test Using DDS

Figure 9A:
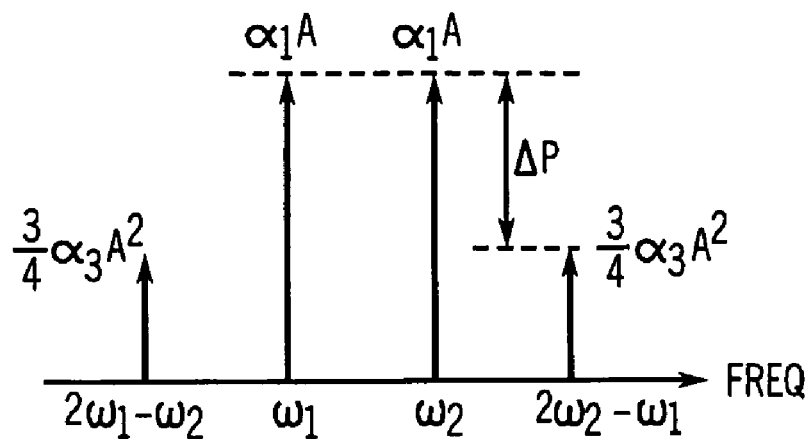
FIG. 9a illustrates a graphical representation of an output spectrum under two tone test.
Figure 9B:
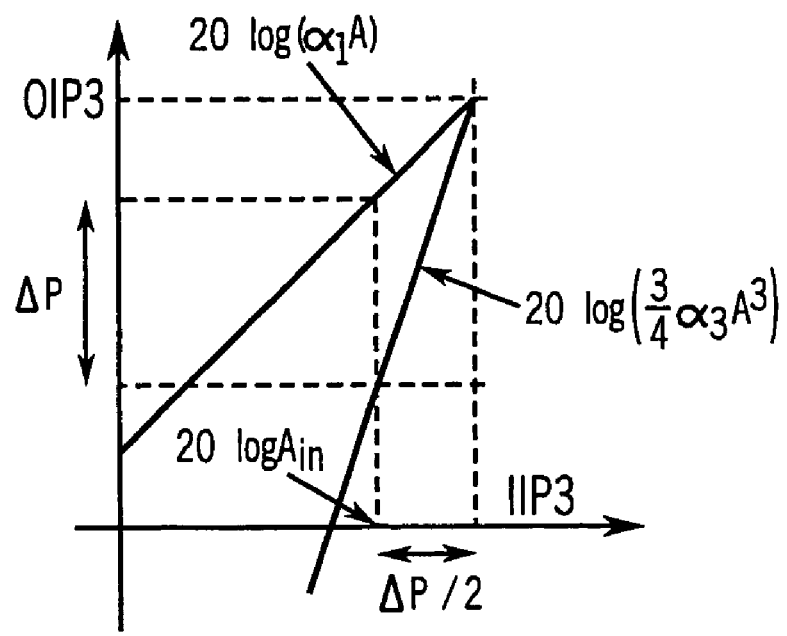
FIG. 9b illustrates a graphical representation of calculating IP3 using IM3 and fundamental terms.

Linearity is an important measure of any amplifier performance. Amplifier linearity is normally measured by the 3rd order inter-modulation product (IP3) using a two-tone test. As will be shown, DDS can be used to generate two frequency tones required in the two-tone test. When the two-tone test signal passes through an amplifier, both fundamental and 3rd order inter-modulation (IM3) terms will be present at the amplifier output as shown in FIGS. 9a and 9b. The input referred IP3 (IIP3) can thus be found by $$IIP_3[dBm] = \frac{\Delta P[dB]}{2} + P_{in}[dBm] \quad (7)$$

where $\Delta P$ is the difference between fundamental and IM3 terms and $P_{in}$ is the signal power at the amplifier input. To measure the IIP3 based on Eq. (7), a fast Fourier transform (FFT) would be required to capture the amplifier output spectrum.

IP3 measurement using FFT requires a large amount of hardware and is undesirable for an efficient BIST implementation. As an alternative, a multiplier is used as the down converter to selectively pick the frequency components and down-convert them into a DC signal. The DC level can be further compacted for evaluation by using an accumulator. The following derivation provides a mathematical proof-of-concept for the proposed IIP3 testing technique.

Assume two tones $x(t)=A_1 \cos \omega_1 t+A_2 \cos \omega_2 t$ are applied to the input of an amplifier with transfer function expressed as $y(t)=\alpha_0+\alpha_1 x(t)+\alpha_2 x^2(t)+\alpha_3 x^3(t)+\ldots$, where $\alpha_j$ are in general independent of time if the system is time invariant. Inserting the two-tone input into the transfer function, the amplifier output is obtained by $$y(t) = \frac{1}{2}\alpha_2(A_1^2 + A_2^2) + \qquad (8)$$

$$\left[\alpha_1 A_1 + \frac{3}{4}\alpha_3 A_1(A_1^2 + 2A_2^2)\right]\cos\omega_1 t +$$

$$\left[\alpha_1 A_2 + \frac{3}{4}\alpha_3 A_2(2A_1^2 + A_2^2)\right]\cos\omega_2 t +$$

$$\frac{1}{2}\alpha_2[A_1^2\cos 2\omega_1 t + A_2^2 \cos 2\omega_2 t] +$$

$$\alpha_2 A_1 A_2[\cos(\omega_1 + \omega_2)t + \cos(\omega_1 - \omega_2)t] +$$

$$\frac{1}{4}\alpha_3[A_1^3\cos 3\omega_1 t + A_2^3\cos 3\omega_2 t] +$$

$$\frac{3}{4}\alpha_3 \cdot \left\{ \begin{array}{l} A_1^2 A_2[\cos(2\omega_1 + \omega_2)t + \cos(2\omega_1 - \omega_2)t] + \\ A_1 A_2^2[\cos(2\omega_2 + \omega_1)t + \cos(2\omega_2 - \omega_1)t] \end{array} \right\}$$

According to Eq. (8), the input referred IP3 (IIP3) and the output referred IP3 (OIP3) can be found as $$IIP_3 \approx \sqrt{\frac{4}{3}\left|\frac{\alpha_1}{\alpha_3}\right|}, \text{ if } \alpha_1 \gg \frac{9}{4}\alpha_3 A^2 \qquad (9)$$

$$OIP_3 = \alpha_1 IIP_3$$

where the assumption for IIP3 is normally valid when the test tone magnitude is relatively small such that the amplifier is not desensitized.

In the BIST approach, the following technique is used for the ORA. As can be seen from FIGS. 9a and 9b, the closest inter-modulation terms to the fundamental are the IM3 terms with frequencies at $2\omega_1-\omega_2$ and $2\omega_2-\omega_1$. First, mixing (multiplying) the amplifier output, Eq. (8), with fundamental tone $A_2 \cos \omega_2 t$, produces a DC term $$DC_1 = \frac{1}{2}A_2^2\left[\alpha_1 + \frac{3}{4}\alpha_3(2A_1^2 + A_2^2)\right] \approx \frac{1}{2}A_2^2\alpha_1 \qquad (10)$$

where the second term in Eq. (10) is normally much smaller than the linear gain, $\alpha_1$, if the input level is small, such that the amplifier is not desensitized. Second, mixing (multiplying) the amplifier output, Eq. (8), with the IM3 tone $A_1 \cos(2\omega_2-\omega_1)t$, produces another DC term $$DC_2 = \frac{3}{8}A_1^2 A_2^2 \alpha_3 \qquad (11)$$

Expressing these two DC terms in dB, we can find the difference $\Delta P$ between fundamental and the IM3 and the IIP3 can thus be measured using Eq. (7). Although dB units may be represented using floating-point format, the actual IP3 value does not need to be found using real hardware in an ORA for a BIST implementation. The linear gain requirement may be pre-calculated to evaluate DC1 and the IM3 requirement to evaluate DC2. Then accumulating these values as they exit the multiplier and averaging based on the number of samples, the results can be compared to pre-determined ranges of acceptable values for a pass-fail BIST indication. For characterization of the circuit, the accumulated values can be read and averaged off-chip to perform the IP3 calculation.

Figure 10:
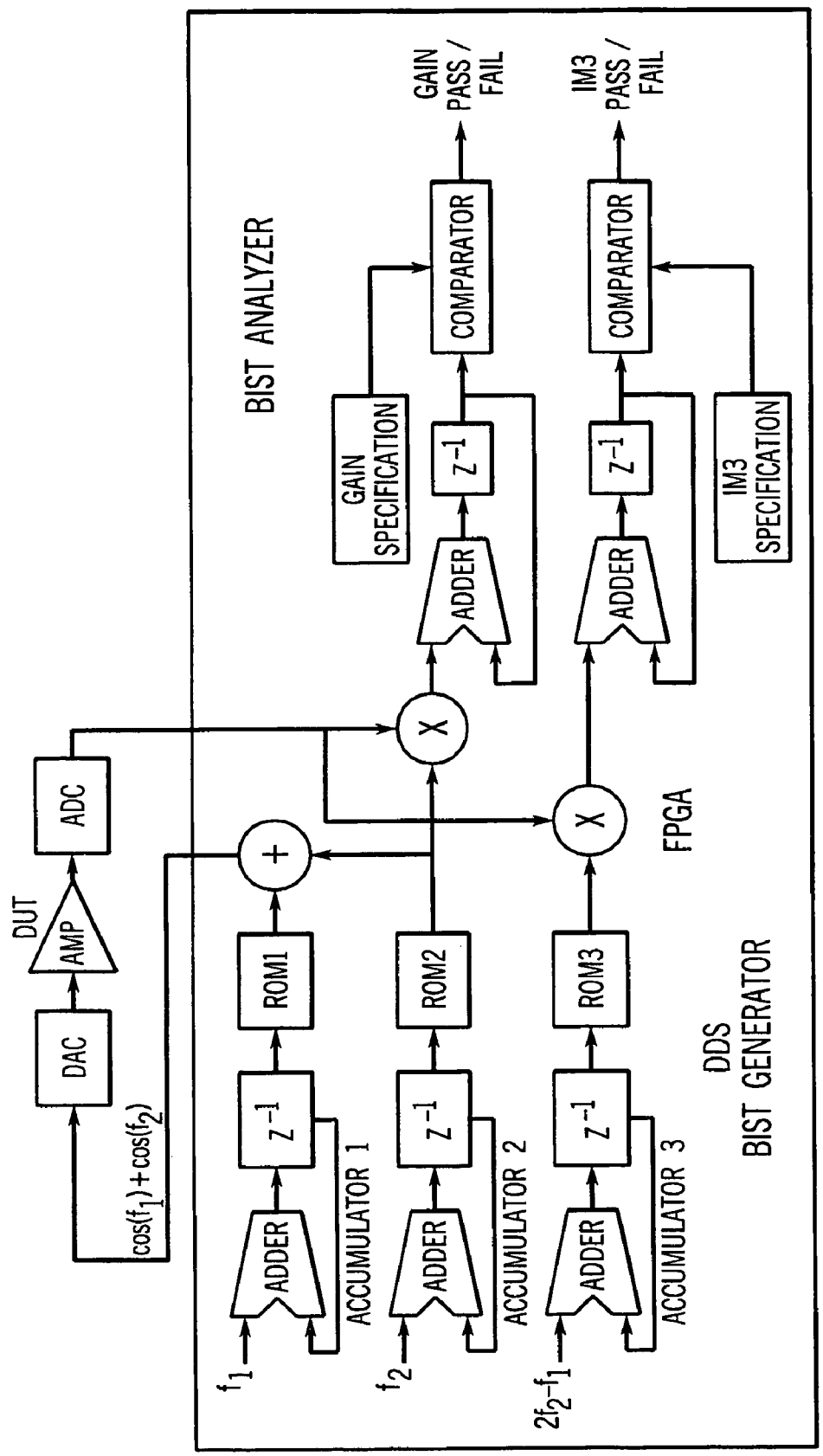
FIG. 10 illustrates a schematic diagram according to an embodiment of the present invention.

The complete TPG and ORA for the BIST architecture are illustrated in FIG. 10. The ORA consists of an N-bit unsigned multiplier (where N is the number of bits from the ADC) and a 2N+M-bit accumulator (where the number of samples is less than $2^M$). A 2's complement transformation is performed on negative numbers entering the accumulator such that subtraction is accomplished by the adder in the accumulator. In addition, the DDS input to the multiplier is converted to a signed magnitude number to remove DC offset from the DDS output. The sign bit is then used to control the 2's complement transformation at the input to the accumulator.

The advantages of the BIST circuitry includes providing the ability for the accurate measurement of phase delay in the analog output response by making multiple measurements of the output response in the multiplier/accumulator based ORA 134 using different phases of base frequencies and calculating the actual phase delay from the accumulated BIST results.

Also, once the phase delay is known for a given frequency, other analog functional measurements can be adjusted for more accuracy. The BIST scheme provides not only analog test capability, but also an efficient technique for calibrating and compensating analog circuitry that is sensitive to temperature, supply voltage and process variations.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

We claim:

1. A linearity measurement circuit, comprising:
   a. a test pattern generator for generating a first sine wave pattern, a second sine wave pattern, and a third sine wave pattern, each sine wave pattern in the form of a digital signal, wherein the first sine wave pattern and the second sine wave pattern are summed by an adder and supplied to a D-A converter and an analog circuit under test;
   b. an A-D converter operative to convert an analog signal outputted from the analog circuit under test to a digital output signal; and
   c. an output response analyzer including a first multiplier and accumulator pair for multiplying and accumulating the digital output signal and the second sine wave pattern to generate a first signal power, and a second multiplier and accumulator pair for multiplying and accumulating the digital output signal and the third sine wave pattern to generate a second signal power.

2. The circuit of claim 1 wherein the test pattern generator comprises a plurality of direct digital synthesizers (DDS) outputting the sine wave patterns.

3. The circuit of claim 2 wherein each DDS comprises an accumulator and a read-only memory (ROM).

4. The circuit of claim 3 wherein the ROM is a look-up table.

5. The circuit of claim 1 wherein a set of phase delay measurements from the circuit correct a linearity measurement.

6. The circuit of claim 5 wherein the linearity measurement monitors performance of an analog circuit and adaptively adjust the analog circuit.

7. The circuit of claim 1, further comprising a multiplexer configured to timeshare the output response analyzer.

8. The circuit of claim 1 wherein the linearity measurement circuit is incorporated in an Applications-Specific Integrated Circuit (ASIC) for making on-chip measurements.

9. The circuit of claim 1 wherein the linearity measurement circuit is incorporated in an ASIC for making in-system measurements.

10. The circuit of claim 1 wherein the linearity measurement circuit is incorporated in an external test device for manufacturing testing of an analog circuit.

11. The circuit of claim 1 wherein the linearity measurement circuit is synthesized into a programmable logic device for off-line test, measurement and compensation.

12. The circuit of claim 11 wherein the programmable logic device is an FPGA.

13. The circuit of claim 1 wherein the circuit is used for test, measurement and compensation of an RF circuit.

14. A phase and gain measurement circuit, comprising:
   a. a test pattern generator for generating a sine wave pattern and a cosine wave pattern, each wave pattern in the form of a digital signal, and supplying the sine wave pattern to a D-A converter and an analog circuit under test;
   b. an A-D converter operative to convert an analog signal outputted from the analog circuit under test to a digital output signal; and
   c. an output response analyzer including a first multiplier and accumulator pair for multiplying and accumulating the digital output signal and the sine wave pattern to generate a first signal power and a second multiplier and accumulator pair for multiplying and accumulating the digital output signal and the cosine wave pattern to generate a second signal power.

15. The circuit of claim 14 wherein the test pattern generator comprises a plurality of direct digital synthesizers (DDS) outputting the sine wave pattern and the cosine wave pattern.

16. The circuit of claim 15 wherein each DDS comprises an accumulator and a read-only memory (ROM).

17. The circuit of claim 16 wherein the ROM is a look-up table.

18. The circuit of claim 14 wherein a frequency response including at least one of a gain and phase delay measurement is measured by the phase-and-gain measurement circuit.

19. The circuit of claim 18 wherein the phase delay measurements from the phase-and-gain measurement circuit are used to correct a linearity measurement.

20. The circuit of claim 18 wherein the phase-and-gain measurement circuit with the phase delay measurements correct a signal-to-noise ratio.

21. The circuit of claim 18 wherein the at least one of a gain-and-phase measurements monitors performance of an analog circuit and adaptively adjusts the analog circuit.

22. The circuit of claim 14 wherein the phase-and-gain measurement circuit is incorporated in an ASIC for making on-chip measurements.

23. The circuit of claim 14 wherein the phase-and-gain measurement circuit is incorporated in an ASIC for making in-system measurements.

24. The circuit of claim 14 wherein the phase-and-gain measurement circuit is incorporated in an external test device for manufacturing testing of an analog circuit.

25. The circuit of claim 14 wherein the phase-and-gain measurement circuit is synthesized into a programmable logic device for off-line test, measurement and compensation.

26. The circuit of claim 25 wherein the programmable logic device is an FPGA.

27. The circuit of claim 14 wherein the circuit is used for test, measurement and compensation of RF circuits.

28. The circuit of claim 14, further comprising a multiplexer configured to timeshare the output response analyzer.

29. A signal-to-noise measurement circuit, comprising:
   a. a test pattern generator for generating a first sine wave pattern, a second sine wave pattern, and a cosine wave pattern, each sine wave pattern in the form of a digital signal, wherein the first sine wave pattern is supplied to a D-A converter and an analog circuit under test;
   b. an A-D converter operative to convert an analog signal outputted from the analog circuit under test to a digital output signal; and
   c. an output response analyzer including a first multiplier and accumulator pair for multiplying and accumulating the digital output signal and the second sine wave pattern to generate a first signal power, and a second multiplier and accumulator pair for multiplying and accumulating the digital output signal and the cosine wave pattern to generate a second signal power.

30. The circuit of claim 29 wherein the test pattern generator comprises a plurality of direct digital synthesizers (DDS) outputting the sine wave patterns and the cosine wave patterns.

31. The circuit of claim 30 wherein each of the DDS includes an accumulator and a read-only memory (ROM).

32. The circuit of claim 31 wherein the ROM is a look-up table.

33. The circuit of claim 29 wherein the signal-to-noise measurement circuit uses a set of phase delay measurements to measure the signal-to-noise ratio.

34. The circuit of claim 33 wherein the set of signal-to-noise measurements monitor performance of an analog circuit and adaptively adjusts the analog circuit.

35. The circuit of claim 29 wherein the signal-to-noise measurement circuit is incorporated in an ASIC for making on-chip measurements.

36. The circuit of claim 29 wherein the signal-to-noise measurement circuit is incorporated in an ASIC for making in-system measurements.

37. The circuit of claim 29 wherein the signal-to-noise measurement circuit is incorporated in an external test device for manufacturing testing of an analog circuit.

38. The circuit of claim 29 wherein the signal-to-noise measurement circuit is synthesized into a programmable logic device for off-line test, measurement and compensation.

39. The circuit of claim 38 wherein the programmable logic device is an FPGA.

40. The circuit of claim 29 wherein the signal-to-noise measurement circuit is used for test, measurement and Compensation of an RF circuit.

41. The circuit of claim 29, further comprising a multiplexer configured to timeshare the output response analyzer.

42. A built-in self test (BIST) architecture for an analog circuit functionality test, the BIST architecture comprising:
   a. a direct digital synthesizer (DDS) configured to generate a test waveform;
   b. a D-A converter configured to receive and convert the test waveform to an analog signal, wherein the analog signal is an input signal for a device under test;
   c. an A-D converter configured to receive an output from the device under test, and further configured to convert the output to a digital signal; and d. an output response analyzer (ORA), wherein the ORA includes:
  i. a multiplier configured to receive the digital signal and the test waveform, and further configured to extract a set of spectrum information at a desired frequency; and
  ii. an accumulator coupled to the multiplier, wherein the accumulator is configured to average an output of the multiplier, wherein the test waveform is generated over a number of clock cycles and the accumulator collects the output from the analog circuit.

* * * * *